(12) United States Patent
Miwa

(10) Patent No.: US 11,547,003 B2
(45) Date of Patent: Jan. 3, 2023

(54) ELECTRONIC DEVICE AND MAINTENANCE METHOD FOR ELECTRONIC DEVICE

(71) Applicant: NEC Platforms, Ltd., Kawasaki (JP)

(72) Inventor: Tomoki Miwa, Kanagawa (JP)

(73) Assignee: NEC Platforms, Ltd., Kanagawa (JP)

( * ) Notice: Subject to any disclaimer, the term of this patent is extended or adjusted under 35 U.S.C. 154(b) by 0 days.

(21) Appl. No.: 17/286,009

(22) PCT Filed: Oct. 28, 2019

(86) PCT No.: PCT/JP2019/042094
§ 371 (c)(1),
(2) Date: Apr. 16, 2021

(87) PCT Pub. No.: WO2020/095740
PCT Pub. Date: May 14, 2020

(65) Prior Publication Data
US 2021/0385953 A1  Dec. 9, 2021

(30) Foreign Application Priority Data
Nov. 9, 2018  (JP) .............. JP2018-211205

(51) Int. Cl.
*H05K 5/00* (2006.01)
*H05K 5/03* (2006.01)
*H05K 7/20* (2006.01)

(52) U.S. Cl.
CPC ........... *H05K 5/003* (2013.01); *H05K 5/0069* (2013.01); *H05K 5/03* (2013.01); *H05K 7/20136* (2013.01)

(58) Field of Classification Search
USPC ....................................................... 361/752
See application file for complete search history.

(56) References Cited

U.S. PATENT DOCUMENTS 5,495,389 A * 2/1996 Dewitt .................... G06F 1/184
220/255
5,784,251 A * 7/1998 Miller .................... G06F 1/187
361/725

(Continued)

FOREIGN PATENT DOCUMENTS

JP  2001257494 A  9/2001
JP  2007183735 A  7/2007

(Continued)

OTHER PUBLICATIONS

International Search Report of PCT Application No. PCT/JP2019/042094 dated Nov. 26, 2019.

(Continued)

*Primary Examiner* — Hung S. Bui

(57) ABSTRACT

An electronic device including a housing that accommodates a circuit board and a first electronic component connected to the circuit board, and that has an opening portion that opens upward; a cover that is provided on an upper portion of the housing, that at least partially covers the opening portion, and that has a second electronic component mounted thereon; a connecting wire that connects the second electronic component to the circuit board; and an opening/closing mechanism that can open and close the cover in a state in which the second electronic component and the circuit board are connected by the connecting wire.

7 Claims, 11 Drawing Sheets

(56) References Cited

U.S. PATENT DOCUMENTS

| | | | |
|---|---|---|---|
| 7,494,195 B2* | 2/2009 | Han | H05K 7/1489 |
| | | | 312/328 |
| 7,751,189 B2* | 7/2010 | Ahuja | G06F 1/20 |
| | | | 165/104.34 |
| 2013/0308264 A1* | 11/2013 | Zhou | G11B 33/124 |
| | | | 361/679.33 |
| 2014/0293523 A1 | 10/2014 | Jau et al. | |
| 2014/0293532 A1* | 10/2014 | Schelshorn | G06F 1/20 |
| | | | 138/155 |
| 2015/0146225 A1 | 5/2015 | Okada | |
| 2016/0128237 A1 | 5/2016 | Szeremeta | |

FOREIGN PATENT DOCUMENTS

| | | |
|---|---|---|
| JP | 2007188371 A | 7/2007 |
| JP | 2011233982 A | 11/2011 |
| JP | 2015128137 A | 7/2015 |
| TW | 201440606 A | 10/2014 |

OTHER PUBLICATIONS

Taiwanese Office Action for TW Application No. 108138576 dated Jan. 6, 2022 with English Translation.

\* cited by examiner

ELECTRONIC DEVICE AND MAINTENANCE METHOD FOR ELECTRONIC DEVICE

This application is a National Stage Entry of PCT/JP2019/042094 filed on Oct. 28, 2019, which claims priority from Japanese Patent Application 2018-211205 filed on Nov. 9, 2018, the contents of all of which are incorporated herein by reference, in their entirety.

TECHNICAL FIELD

The present invention relates to an electronic device and a maintenance method for an electronic device.

BACKGROUND ART

Various types of electronic devices contain multiple electronic components in a housing. In order to assemble and perform maintenance on the electronic devices, the housings are often provided with a housing having an opening portion and a cover provided so as to be able to open and close the opening portion in the housing.

For example, Patent Document 1 discloses a configuration provided with a housing (base housing) containing electronic components (constituent components), and a cover (cover housing) that is combined with the housing. With this configuration, electronic components are also mounted on the rear side of the cover, facing into the housing.

PRIOR ART DOCUMENTS

Patent Documents

[Patent Document 1]
JP 2011-233982 A

SUMMARY OF INVENTION

Problems to Be Solved By the Invention

When performing maintenance or the like on an electronic device, the cover is removed from the housing after having disconnected the electronic components from a power supply. For this reason, it is difficult to perform so-called online replacement in which some of the electronic components provided among the electronic components are replaced while continuously supplying power to the electronic device. As a result thereof, there is a problem in that a lot of work is required to perform maintenance on the electronic device.

An objective of the present invention is to solve the above-mentioned problem. In other words, an objective of the present invention is to provide an electronic device and an electronic device maintenance method that solve the problem wherein a lot of work is required to perform maintenance on the electronic device.

Means for Solving the Problems

An electronic device of the present invention includes a housing that accommodates a circuit board and a first electronic component connected to the circuit board, and that has an opening portion that opens upward; a cover that is provided on an upper portion of the housing, that at least partially covers the opening portion, and that has a second electronic component mounted thereon; a connecting wire that connects the second electronic component to the circuit board; and an opening/closing mechanism that can open and close the cover in a state in which the second electronic component and the circuit board are connected by the connecting wire.

The electronic device maintenance method of the present invention includes preparing, for a housing having an opening portion that opens upward and having a circuit board and a first electronic component connected to the circuit board, a cover provided at a position at least partially covering the opening portion; moving the cover, in a state in which a second electronic component mounted on the cover is connected, by a connecting wire, to the circuit board accommodated in the housing, to a position at which an area above the opening portion is opened; performing work on the first electronic component provided inside the housing from above the opening portion; and returning the cover to a position at least partially covering the opening portion after performing the work on the first electronic component.

Advantageous Effects of the Invention

According to the electronic device and the electronic device maintenance method of the present invention, the amount of work required for maintenance of the electronic device can be suppressed.

EXAMPLE EMBODIMENTS

Multiple embodiments of the present invention will be explained below with reference to the drawings. Regarding portions that are the same as those in one conventional example mentioned above in connection with the present embodiments, the same names will be used and detailed descriptions thereof will be omitted.

First Embodiment

Figure 1:
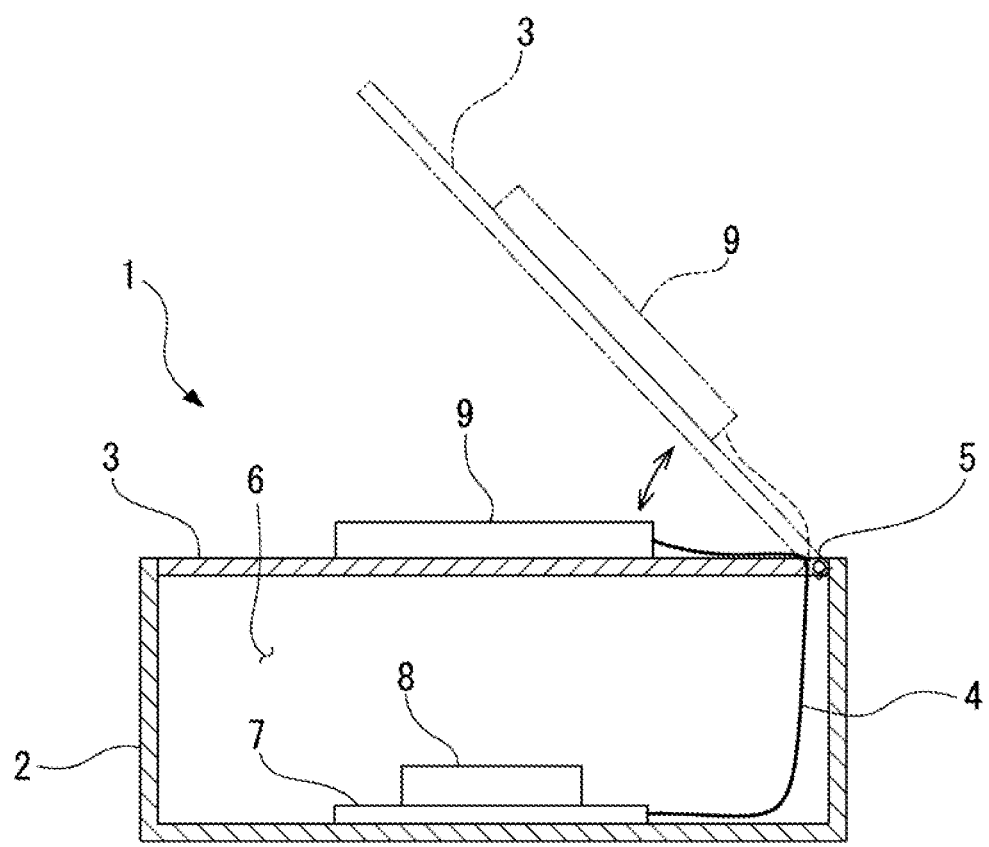
FIG. 1 is a side section view illustrating a first embodiment, which is the minimum configuration of the electronic device.

FIG. 1 is a diagram illustrating a first embodiment, which is the minimum configuration of the electronic device.

As illustrated in this diagram, the electronic device 1 only needs to be provided with at least a housing 2, a cover 3, a connecting wire 4, and an opening/closing mechanism 5.

The housing 2 has an opening portion 6 that opens upward. The housing 2 accommodates a circuit board 7, and a first electronic component 8 that is connected to the circuit board 7. The number and type of the first electronic component 8 are not limited in any way. Additionally, multiple types of components may be accommodated in the housing 2 as the first electronic component 8.

The cover 3 is provided on an upper portion of the housing 2. The cover 3 at least partially covers the opening portion 6. A second electronic component 9 is mounted on the cover 3.

The connecting wire 4 connects the second electronic component 9 with the circuit board 7.

As indicated by the double-dotted chain line in FIG. 1, the opening/closing mechanism 5 allows the cover 3 to be opened and closed in a state in which the second electronic component 9 and the circuit board 7 are connected by the connecting wire 4.

With this electronic device 1, the cover 3 can be opened and closed by the opening/closing mechanism 5 while the second electronic component 9 and the circuit board 7 remain in a state of connection by the connecting wire 4. As a result thereof, maintenance work can be performed, such as by replacing only the necessary components, without suspending the supply of power to the entire electronic device 1. Additionally, by opening the cover 3, maintenance work can be easily performed on the first electronic component 8 and the circuit board 7 in the housing 2, which are arranged to be under the cover 3. Therefore, the amount of work required for performing maintenance on the electronic device 1 can be suppressed.

In FIG. 1 illustrating the first embodiment, the cover 3 is illustrated as being opened and closed by pivoting by means of the opening/closing mechanism 5. However, there is no such limitation. The cover 3 may open and close the opening portion 6 by sliding in a direction along the surface thereof, or by moving by means of an arm mechanism or a link mechanism.

Second Embodiment

Figure 2:
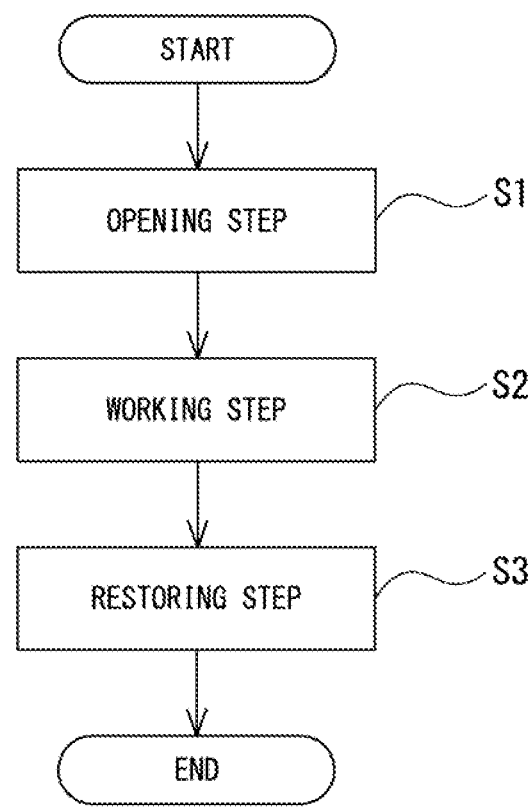
FIG. 2 is a flow chart illustrating a second embodiment, which is the minimum configuration of the electronic device maintenance method.
Figure 3:
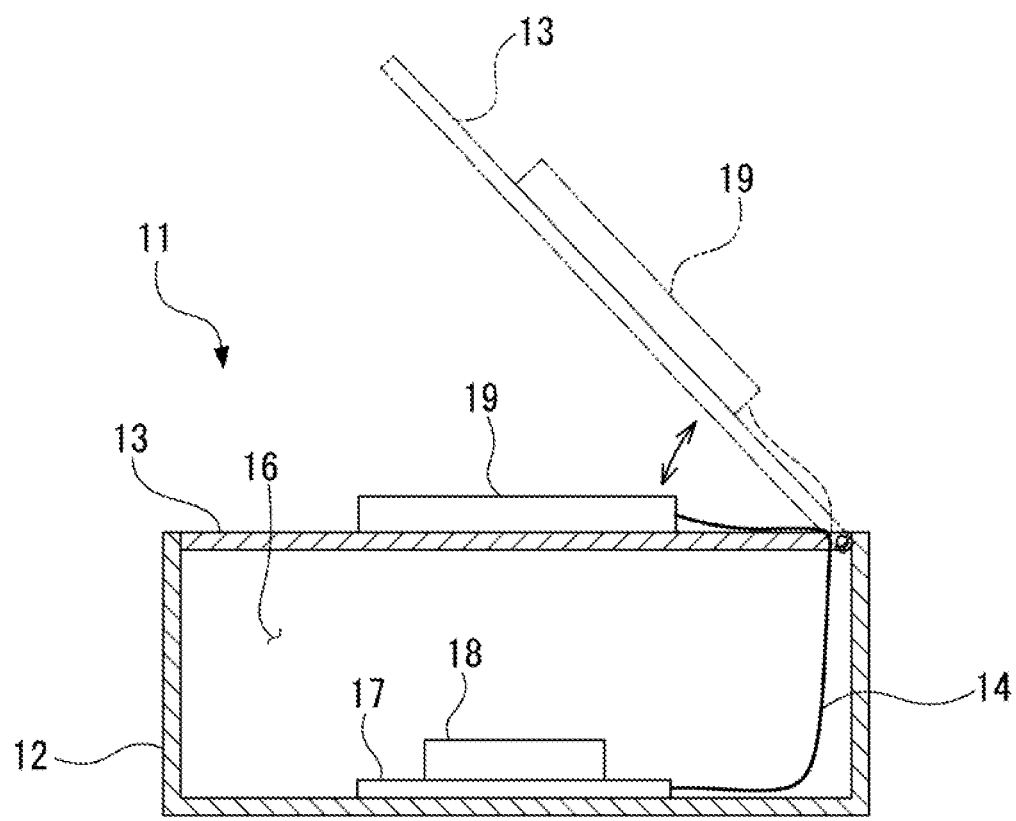
FIG. 3 is a side section view illustrating an electronic device on which the electronic device maintenance method according to the second embodiment is to be performed.

FIG. 2 is a flow chart illustrating a second embodiment, which is the minimum configuration of the electronic device maintenance method. FIG. 3 is a diagram illustrating the electronic device on which the electronic device maintenance method according to the second embodiment is performed.

As illustrated in FIG. 2, the maintenance method for the electronic device 11 need only involve at least an opening step S1, a working step S2, and a restoring step S3.

As illustrated in FIG. 3, the electronic device 11 that is the target of the electronic device maintenance method of the present embodiment is provided with a housing 12 and a cover 13.

The housing 12 has an opening portion 16 that opens upward. The housing 12 accommodates a circuit board 17, and a first electronic component 18 connected to the circuit board 17.

The cover 13 is provided at a position at least partially covering the opening portion 16. A second electronic component 19 is mounted on the cover 13.

The second electronic component 19 mounted on the cover 13 and the circuit board 17 accommodated in the housing 12 are connected by a connecting wire 14.

During the opening step S1, as indicated by the double-dotted chain lines in FIG. 3, the cover 13 is moved relative to the housing 12, in a state in which the second electronic component 19 and the circuit board 17 are connected by the connecting wire 14, to a position at which the area above the opening portion 16 is opened.

During the working step S2, work is performed, from above the opening portion 16, on the first electronic component 18 provided inside the housing 12.

During the restoring step S3, as indicated by the solid lines in FIG. 3, after the first electronic component 18 has been detached and reattached, the cover 13 is returned to a position at least partially covering the opening portion 16.

This method for performing maintenance on the electronic device 11 involves moving the cover 13 so as to open the area above the opening portion 16 in a state in which the second electronic component 19 and the circuit board 17 are connected by the connecting wire 14. As a result thereof, maintenance work can be performed by replacing only the necessary components or the like without disconnecting the power to the entire electronic device 11. Additionally, by opening the cover 13, work can be easily performed on the first electronic component 18, inside the housing 12, disposed under the cover 13. Therefore, the amount of work required for performing maintenance on the electronic device 11 can be suppressed.

In FIG. 3 illustrating the second embodiment, the cover 13 is illustrated as being opened and closed by pivoting. However, there is no such limitation. The cover 13 may open and close the opening portion 16 by sliding in a direction along the surface thereof, or by moving by means of an arm mechanism or a link mechanism.

Third Embodiment

Figure 4:
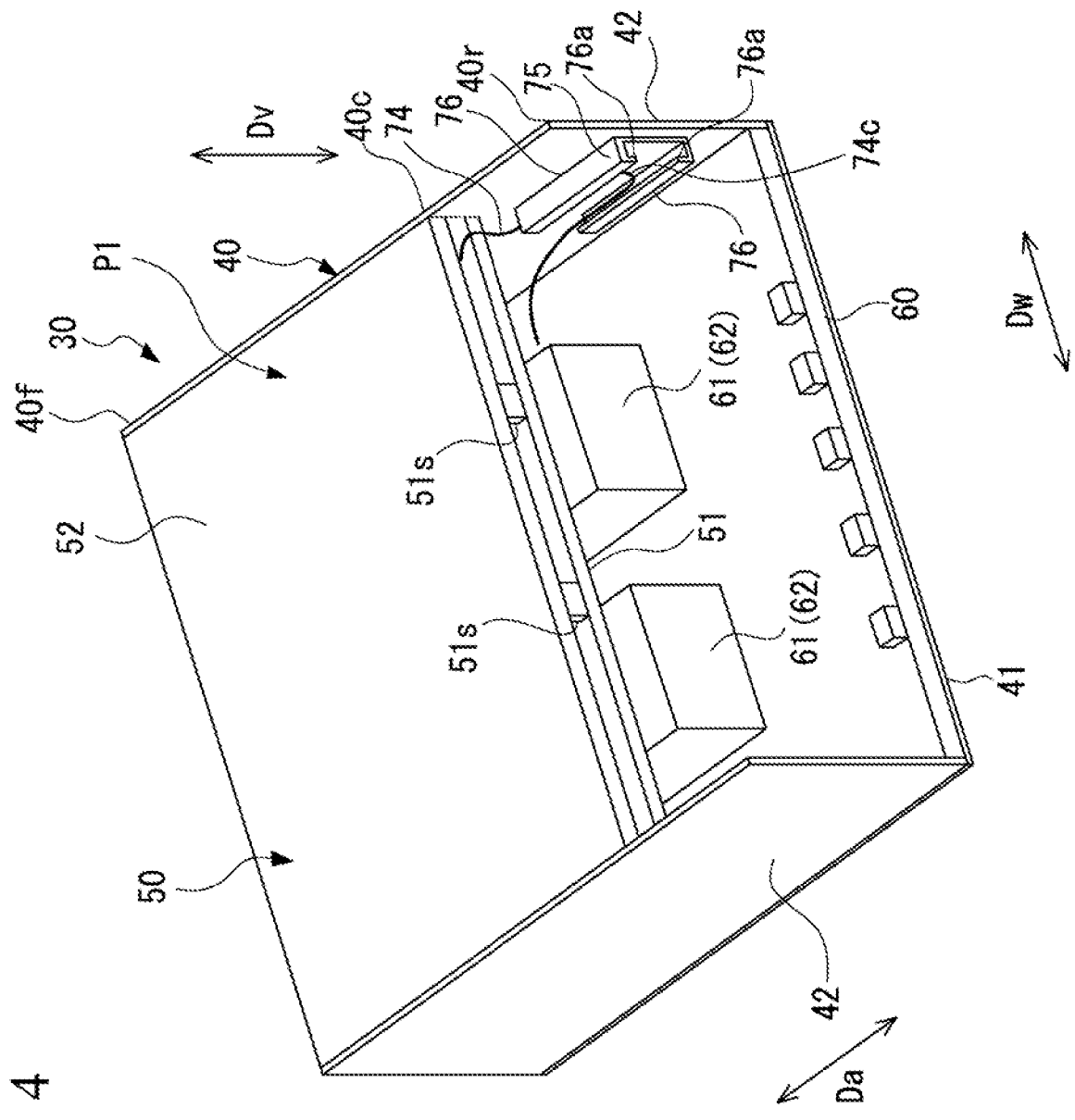
FIG. 4 is a perspective view illustrating an electronic device according to a third embodiment.
Figure 5:
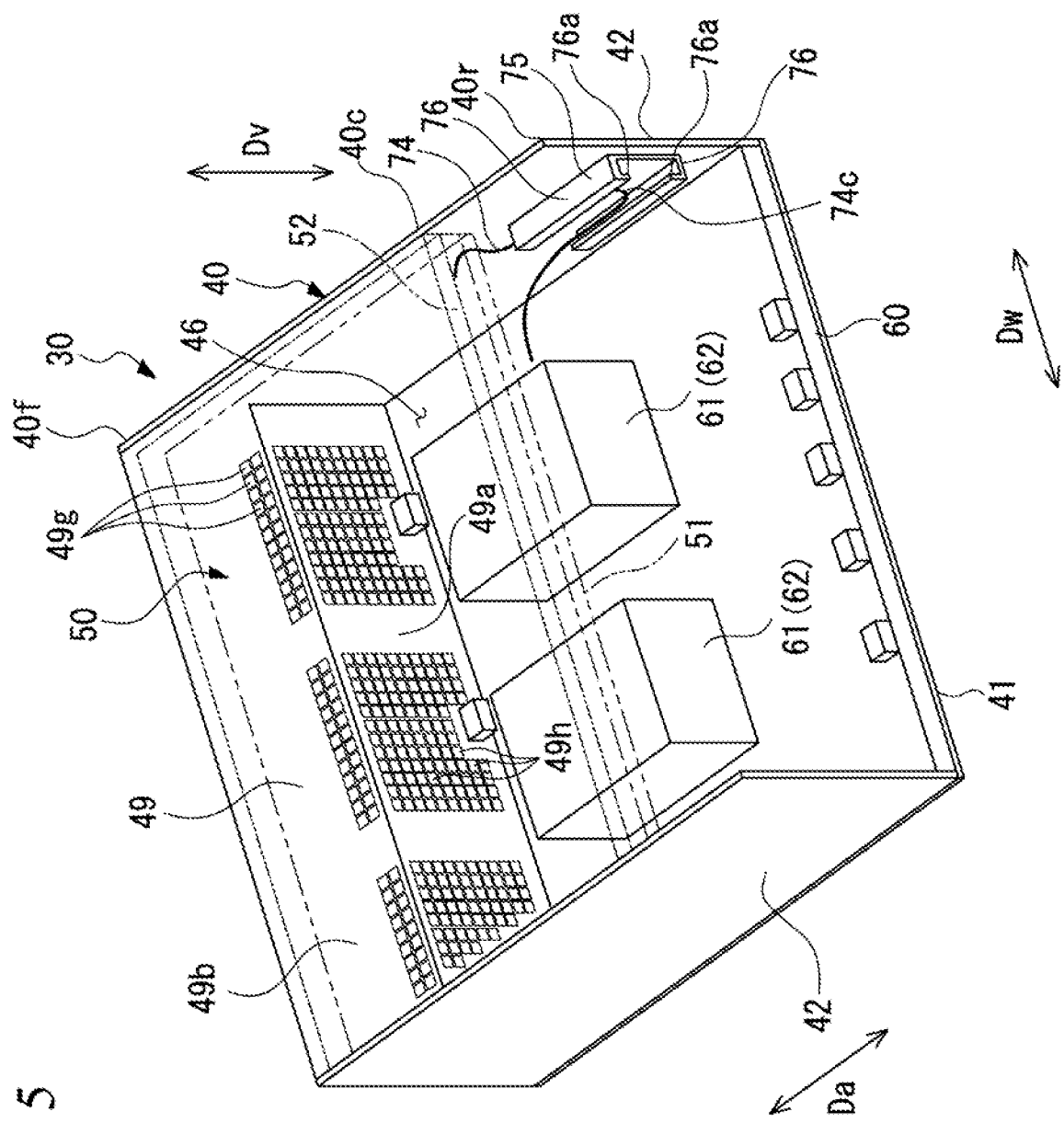
FIG. 5 is a perspective view illustrating the electronic device according to the third embodiment, with the cover unit removed.
Figure 6:
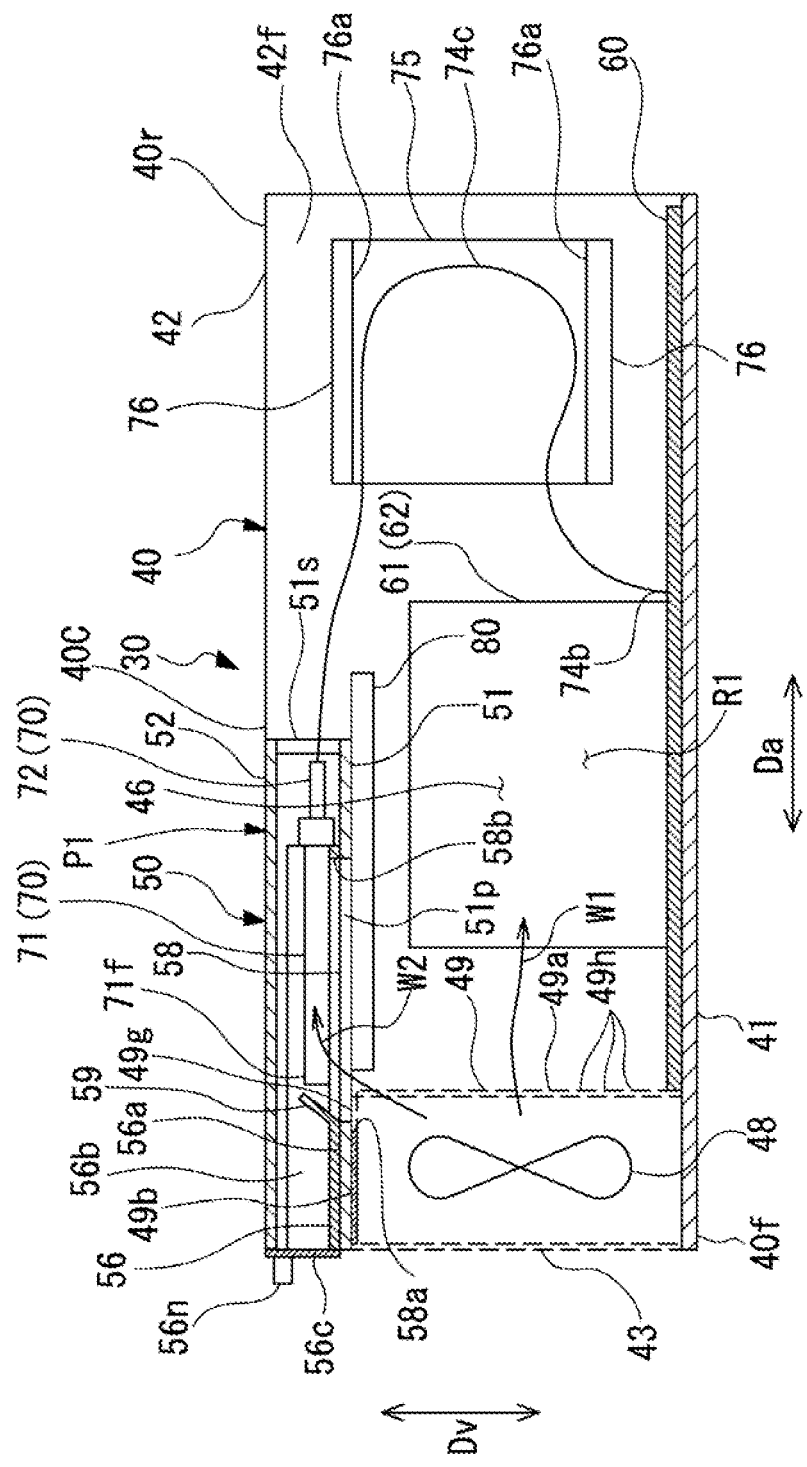
FIG. 6 is a side section view illustrating the electronic device according to the third embodiment.

FIG. 4 is a perspective view, seen from a diagonally rearward direction, illustrating an electronic device according to a third embodiment. FIG. 5 is a perspective view, seen from a diagonally rearward direction, illustrating the electronic device according to the third embodiment in a state in which the cover unit is removed. FIG. 6 is a side section view illustrating the electronic device according to the third embodiment.

As illustrated in FIG. 4 to FIG. 6, the electronic device 30 of the third embodiment is mainly provided with a housing 40 and a cover unit (cover) 50. The electronic device 30 of the third embodiment is, for example, a server device that is accommodated in a server rack, which is not illustrated.

The housing 40 forms the outer shell of the electronic device 30. The housing 40 is provided with a bottom plate 41, a pair of side plates 42, and a front plate portion 43.

In the description below, the direction in which the pair of side plates 42 face each other is defined as the width direction Dw, the direction orthogonal to the bottom plate 41 is defined as the vertical direction Dv, and the direction orthogonal to the width direction Dw and the vertical direction Dv is defined as the anterior-posterior direction Da.

The bottom plate 41 forms the lower surface of the housing 40. The bottom plate 41 is rectangular in plan view.

The pair of side plates 42 are provided on both sides, in the width direction Dw, of the housing 40. The pair of side plates 42 are respectively provided so as to rise upward, in the vertical direction Dv, from both end portions of the bottom plate 41 in the width direction Dw.

As illustrated in FIG. 6, the front plate portion 43 is provided on the front end portion 40*f* of the housing 40 in the anterior-posterior direction Da. The front plate portion 43 is provided so as to block the area between the pair of side plates 42 at the front end portion 40*f* of the housing 40. A plurality of openings (not illustrated) for introducing air for ventilation are formed in the front plate portion 43.

As illustrated in FIG. 5, this housing 40 has an opening portion 46 that opens upward, in the vertical direction Dv, between the pair of side plates 42.

Additionally, the housing 40 opens rearward, in the anterior-posterior direction Da, between the pair of side plates 42.

As illustrated in FIG. 6, cooling fans 48 and a fan cover 49 are provided on the front end portion 40*f* of the housing 40.

For example, three cooling fans 48 are provided in a row in the width direction Dw. By removing fastening screws that are not illustrated, the cooling fans 48 can be detached from the front plate portion 43 of the housing 40 in the forward direction in the anterior-posterior direction Da.

Each cooling fan 48 generates air that flows, inside the housing 2, rearward (the side opposite to the side on which the front plate portion 43 is provided) from the front area (the side on which the front plate portion 43 is provided) in the anterior-posterior direction Da.

As illustrated in FIG. 5 and FIG. 6, the fan cover 49 is provided with a rear panel portion 49*a* and an upper panel portion 49*b*. The rear panel portion 49*a* is provided to the rear of the cooling fans 48 in the anterior-posterior direction Da. The rear panel portion 49*a* is provided so as to be spaced in the anterior-posterior direction Da with respect to the front plate portion 43. The rear panel portion 49*a* is in the form of a panel arranged parallel to the front plate portion 43, i.e., within a plane orthogonal to the anterior-posterior direction Da.

The upper panel portion 49*b* extends from the upper end of the rear panel portion 49*a* forward in the anterior-posterior direction Da. The upper panel portion 49*b* is provided so as to cover the area above the cooling fans 48.

A plurality of rear ventilation holes 49*h* are formed in the rear panel portion 49*a* of the fan cover 49. The rear ventilation holes 49*h* penetrate through the rear panel portion 49*a* in the anterior-posterior direction Da. Additionally, multiple upper ventilation holes 49*g* are formed in a rear portion, in the anterior-posterior direction Da, of the upper panel portion 49*b*. The upper ventilation holes 49*g* penetrate through the upper panel portion 49*b* in the vertical direction Dv. These rear ventilation holes 49*h* and upper ventilation holes 49*g* are arranged on the downstream side in the flow direction of the air from the cooling fans 48. The air from the cooling fans 48 passes through the rear ventilation holes 49*h* and the upper ventilation holes 49*g*, thereby flowing rearward in the anterior-posterior direction Da, and diagonally rearward and upward, from the fan cover 49.

The housing 40 accommodates a circuit board 60 and first electronic components 61 in the interior thereof.

The circuit board 60 is in the form of a panel that is rectangular in plan view, and is provided along the bottom plate 41 of the housing 40.

The first electronic components 61 are connected to the circuit board 60. The first electronic components 61 may, for example, be a CPU (Central Processing Unit) 62, a memory unit (not illustrated), a connector (not illustrated) or the like mounted on the circuit board 60. Additionally, the first electronic components 61 are not limited to being mounted on the circuit board 60, and may be installed at other locations in the housing 40.

The cover unit 50 is provided so as to be spaced in the vertical direction Dv relative to the bottom plate 41. The cover unit 50 is provided between the pair of side plates 42. In the third embodiment, the cover unit 50 is provided so as to block an area of the housing 40 above and between the pair of side plates 42 within a range from the front end portion 40*f* in the anterior-posterior direction Da to a middle portion 40*c* in the anterior-posterior direction Da. In other words, in the third embodiment, the housing 40 is always open upwards between the pair of side plates 42 in a portion to the rear of the cover unit 50 located at the middle portion 40*c* in the anterior-posterior direction Da. The opening in the portion to the rear of the cover unit 50 may also be covered by a top plate or the like, not illustrated, covering the area between the pair of side plates 42.

The cover unit 50 is provided with a base plate 51, a top cover 52, and second electronic components 70.

Figure 7:
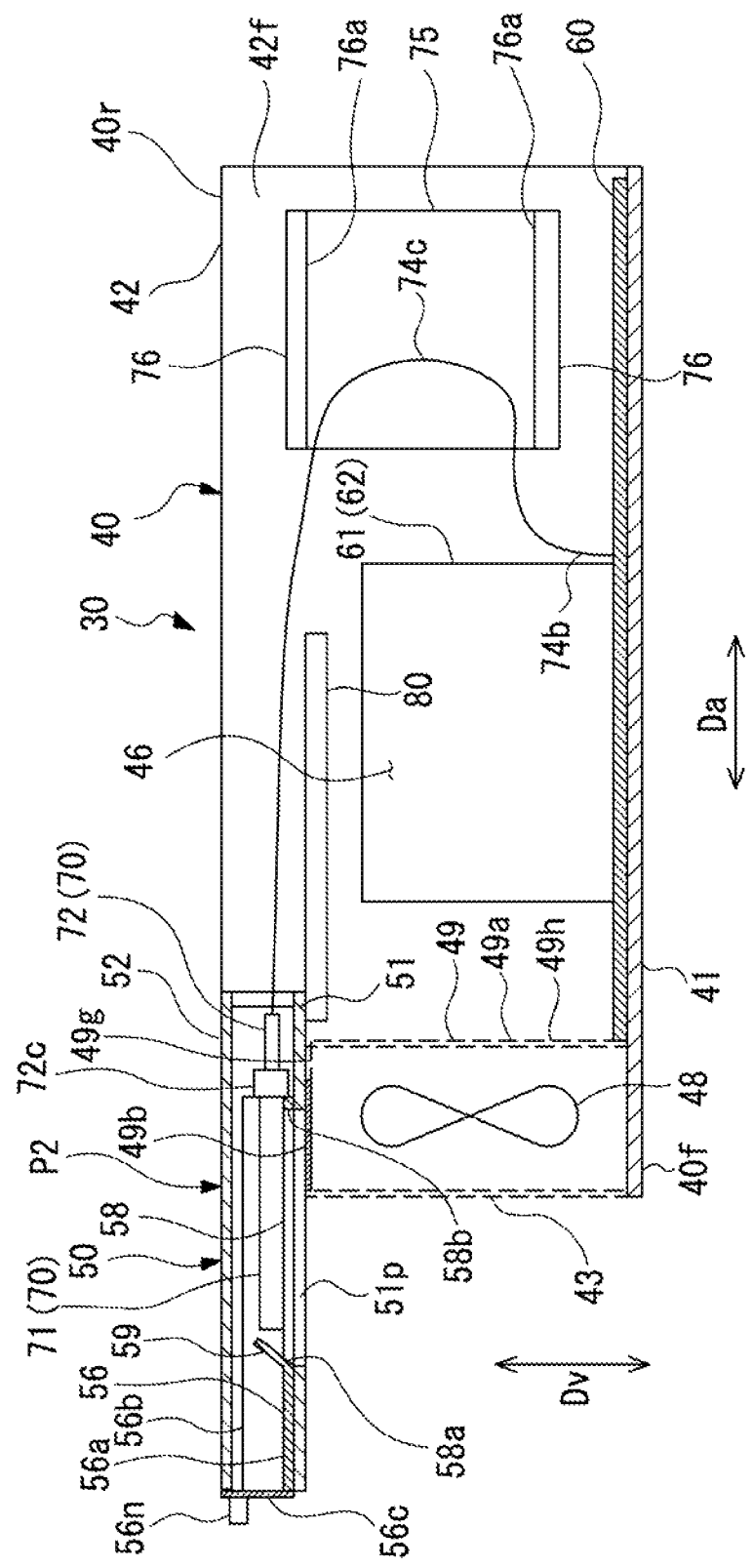
FIG. 7 is a side section view illustrating the electronic device according to the third embodiment, in which the cover unit has been slid forward.

FIG. 7 is a side section view illustrating the electronic device according to the third embodiment, in a state in which the cover unit has been slid forward.

The base plate 51 is in the shape of a panel that is rectangular in plan view and is arranged in a plane orthogonal to the vertical direction Dv. Both sides, in the width direction Dw, of the base plate 51 are supported by guide rails (opening/closing mechanisms) 80 provided on the inner surfaces 42*f* of the pair of side plates 42. The guide rails 80 extend in the anterior-posterior direction Da. The base plate 51 is supported so as to be able to slide in the anterior-posterior direction Da along the pair of guide rails 80. The base plate 51 is able to slide forward, in the anterior-posterior direction Da, from a position P1 at which the housing 40 is covered from the front end portion 40*f* to the middle portion 40*c* thereof. As illustrated in FIG. 7, the base plate 51, when slid forward, in the anterior-posterior direction Da, from the position P1, can be moved to a position P2 at which it protrudes further forward than the front end portion 40*f* of the housing 40. In the state in which the base plate 51 (cover unit 50) has moved to position P2, the opening portion 46 in the housing 40 is opened upward.

As illustrated in FIG. 6, the top cover 52 is arranged so as to be spaced upward, in the vertical direction Dv, with respect to the base plate 51. The top cover 52 is in the shape of a panel that is rectangular in plan view and is arranged parallel to the base plate 51. As a result thereof, a space is formed between the base plate 51 and the top cover 52. The top cover 52 is connected to a support portion 51*s* provided so as to rise upward from the base plate 51. The top cover 52 is detachably engaged, by means of, for example, a latch or the like, to the base plate 51.

Figure 8:
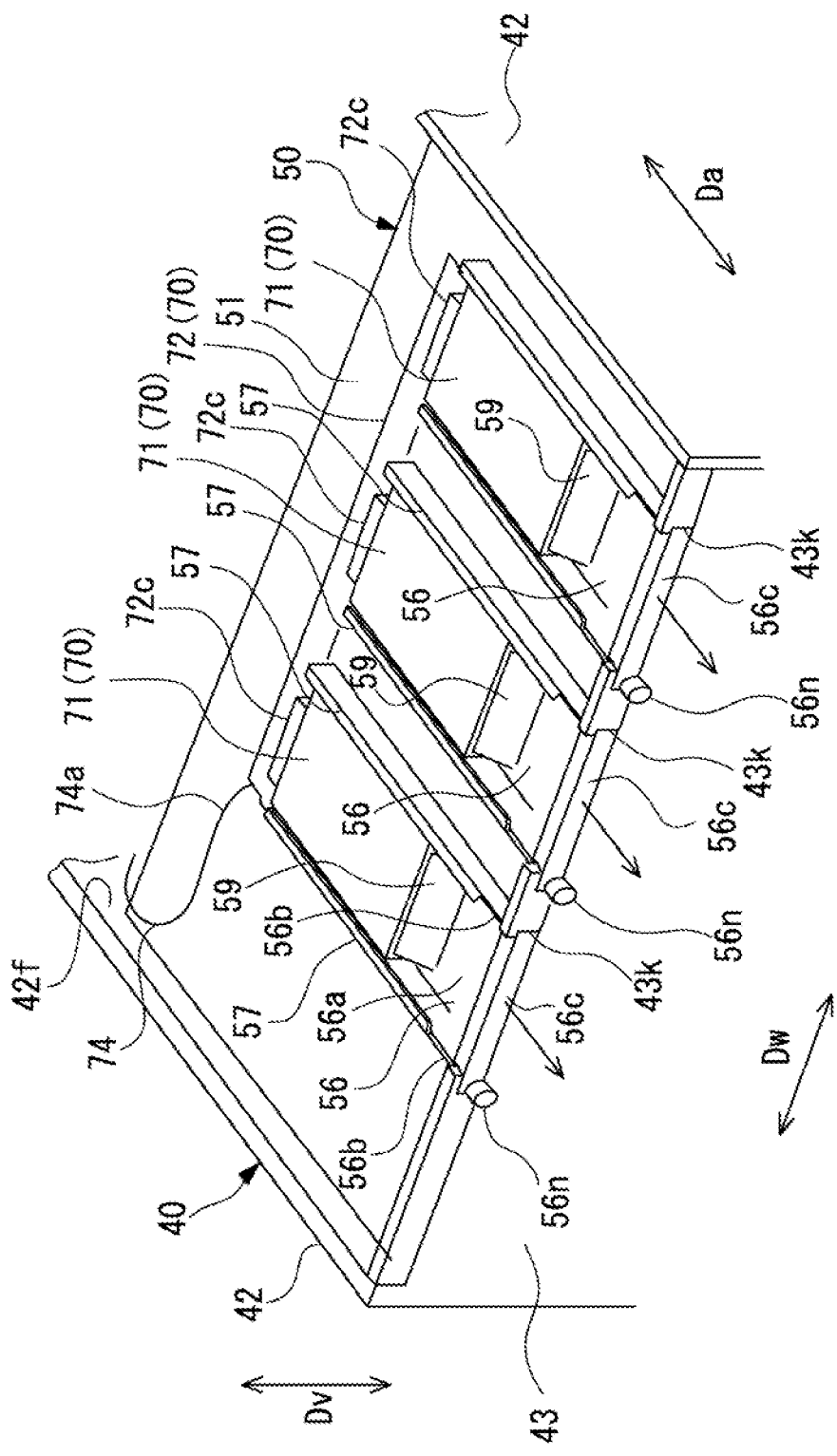
FIG. 8 is a perspective view illustrating second electronic components mounted on the cover unit of the electronic device according to the third embodiment.

FIG. 8 is a perspective view illustrating second electronic components mounted on the cover unit of the electronic device according to the third embodiment.

As illustrated in FIG. 6 and FIG. 8, second electronic components 70 are mounted on the cover unit 50. The second electronic components 70 are provided on the base plate 51 of the cover unit 50. The second electronic components 70 are covered by the top cover 52.

As the second electronic components 70, it is possible to provide, for example, a storage device 71 such as an SSD (Solid State Drive), a connection board 72, an interface board having various functions, or various other types of electronic components and the like.

In this case, the second electronic components 70 are preferably arranged to be components, like a storage device 71 such as an SSD, that are more frequently replaced than the first electronic components 61 that are accommodated in the housing 40.

Figure 9:
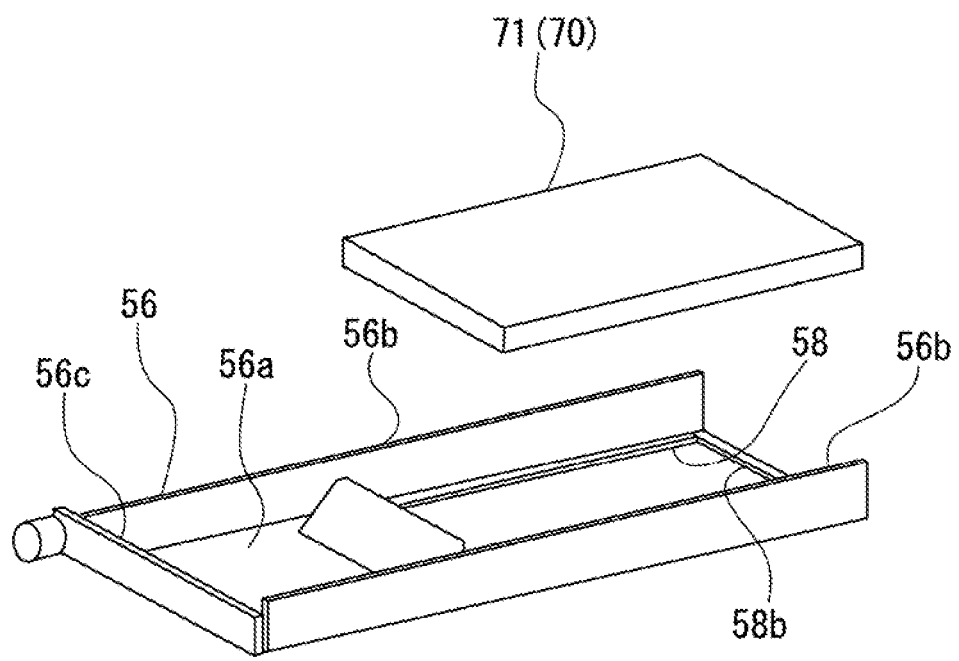
FIG. 9 is a perspective view illustrating a tray provided on the electronic device according to the third embodiment.

FIG. 9 is a perspective view illustrating a tray provided in the electronic device according to the third embodiment.

A storage device 71 is provided on the base plate 51 with a tray 56 therebetween. As illustrated in FIG. 9, the tray 56 has a bottom plate portion 56*a*, a pair of side plate portions 56*b*, and a front end plate 56*c*.

The bottom plate portion 56*a* has a rectangular shape having long sides aligned with the anterior-posterior direction Da in plan view. The bottom plate portion 56*a* is arranged along the upper surface of the base plate 51.

The pair of side plate portions 56*b* rise upward from both sides, in the width direction Dw, of the bottom plate portion 56*a*. The pair of side plate portions 56*b* extend continuously in the anterior-posterior direction Da along both ends, in the width direction Dw, of the bottom plate portion 56*a*. Both ends of the storage device 71 in the width direction Dw are fixed, by means of screws (not illustrated), to the pair of side plate portions 56*b*.

The front end plate 56*c* rises upward from the front end, in the anterior-posterior direction Da, of the bottom plate portion 56*a*. The front end plate 56*c* extends continuously in the width direction Dw.

Such a tray 56 is supported so as to be able to slide, in the anterior-posterior direction Da, with respect to the base plate 51. As illustrated in FIG. 8, the base plate 51 has guide members 57 on both sides, in the width direction, of the pair of side plate portions 56*b*. The pair of guide members 57 extend in the anterior-posterior direction Da and guide the pair of side plate portions 56*b* so as to be able to slide in the anterior-posterior direction Da.

Slot openings (slots) 43*k* for pushing in and pulling out the trays 56 are formed in the front plate portion 43 of the housing 40. A tray 56 and a storage device 71 supported on the tray 56 can be detached from the housing 40 to the outside through a slot opening 43*k*. In other words, the storage device 71 can be detached from the cover unit 50 together with the tray 56.

The front end plate 56*c* of the tray 56 is provided so as to cover the slot opening. A screw member 56*n* for fastening the front end plate 56*c* to the front plate portion 43 is provided in the front end plate 56*c*.

Additionally, a ventilation opening 58 is formed in the bottom plate portion 56*a* of the tray 56. The ventilation opening 58 penetrates through the bottom plate portion 56*a* in the vertical direction Dv. The ventilation opening 58 is rectangular in plan view, having long sides aligned with the anterior-posterior direction Da. As illustrated in FIG. 6, the front edge 58*a* of the ventilation opening 58 is located further forward, in the anterior-posterior direction Da, than the front end 71*f* of the storage device 71 fixed to the tray 56. Additionally, the rear edge 58*b* of the ventilation opening 58 is located under the rear end 54*r* of the storage device 71.

A communication opening 51*p* is formed in the base plate 51 at a position facing the ventilation opening 58 in the vertical direction Dv. The communication opening 51*p* penetrates through the base plate 51 in the vertical direction Dv. The communication opening 51*p* communicates with the ventilation opening 58.

An air guide 59 is provided on the front edge 58*a* of the ventilation opening 58. The air guide 59 extends diagonally upward, in the rearward direction in the anterior-posterior direction Da, from the front of the upper ventilation hole 49*g* in the fan cover 49.

Some of the air that has passed from the cooling fan 48 through the upper ventilation hole 49*g* and the rear ventilation hole 49*h* in the fan cover 49 passes through the ventilation opening 58 and cools the storage device 71 supported on the tray 56. The air guide 59 efficiently guides the air that has passed through the upper ventilation hole 49*g* towards the storage device 71.

As illustrated in FIG. 8, for example, three sets of such storage devices 71 and trays 56 are provided in the width direction Dw on the base plate 51.

On the base plate 51, a connection board 72 is provided to the rear of these storage devices 71 in the anterior-posterior direction Da. The connection board 72 is in the form of a strip extending in the width direction Dw. The connection board 72 is provided with connectors 72*c* to which the respective storage devices 71 can be detachably connected. The storage devices 71 are inserted in the connectors 72*c* by being slid, together with the trays 56, in the anterior-posterior direction Da.

One end 74*a* of a connecting wire 74 is connected to the connection board 72. The connecting wire 74 connects the second electronic component 70 with the circuit board 60. The connecting wire 74 extends in the width direction Dw on the base plate 51, and is arranged to follow the inner surface 42*f* of a side plate 42 of the housing 40 on one side in the width direction Dw. As illustrated in FIG. 6, the connecting wire 74 is guided under the base plate 51 along the inner surface 42*f* of the side plate 42. The other end 74*b* of the connecting wire 74 is connected to a circuit board 60 on the bottom plate 41. A slack portion 74*c* is provided between the one end 74*a* and the other end 74*b* of the connecting wire 74. The slack portion 74*c* is formed by curving the connecting wire 74 in an approximate U shape along the inner surface 42*f* of the side plate 42.

A wire supporting portion 75 is provided on the inner surface 42*f* of the side plate 42. The wire supporting portion 75 is fixed to the inner surface 42*f*. As illustrated in FIG. 4 and FIG. 6, the wire supporting portion 75 has a pair of supporting walls 76. The pair of supporting walls 76 are provided so as to be spaced apart in the vertical direction Dv. The supporting walls 76 extend continuously in the anterior-posterior direction Da. The supporting walls 76 are orthogonal to the inner surface 42*f* and protrude towards the inner sides, in the width direction Dw, from the inner surface 42*f*. Restricting walls 76*a* that protrude in the vertical direction Dv are formed at the ends on the inner sides, in the width direction Dw, of the supporting walls 76. The slack portion 74*c* of the connecting wire 74 is disposed between the upper and lower pair of supporting walls 76. The slack portion 74*c* is restrained, by the restricting walls 76*a* of the upper and lower pair of supporting walls 76, from being displaced in a direction away from the inner surface 42*f* towards the inner side in the width direction Dw. As a result thereof, as the cover unit 50 slides, the slack portion 74*c* of the connecting wire 74 is deformed substantially within a two-dimensional plane along the side plate 42, and can thus be kept from interfering with the first electronic component 61 and the like in the housing 40.

As illustrated in FIG. 4 and FIG. 6, the cover unit 50 of the above-described electronic device 30 is normally disposed at the position P1 at which the base plate 51 covers the housing 40 from the front end portion 40*f* to the middle portion 40*c* thereof.

In this state, as illustrated in FIG. 6, a portion W1 of the air from a cooling fan 48 passes under the base plate 51. Since the base plate 51 extends to the middle portion 40c of the housing 40, a duct-shaped cooling air passage R1 that is continuous in the anterior-posterior direction is formed by being surrounded by the bottom plate 41 of the housing 40, the pair of side plates 42, and the base plate 51. A portion of the air from the cooling fan 48 passes through this cooling air passage R1, thereby efficiently cooling the first electronic component 61 disposed inside the housing 40.

Additionally, the remaining portion W2 of the air from the cooling fan 48 passes through the communication opening 51p and the ventilation opening 58, and flows to the upper side of the base plate 51. As a result thereof, the second electronic components 70 mounted on the cover unit 50 are efficiently cooled.

Next, a maintenance method for the above-mentioned electronic device 30 will be explained.

Figure 10:
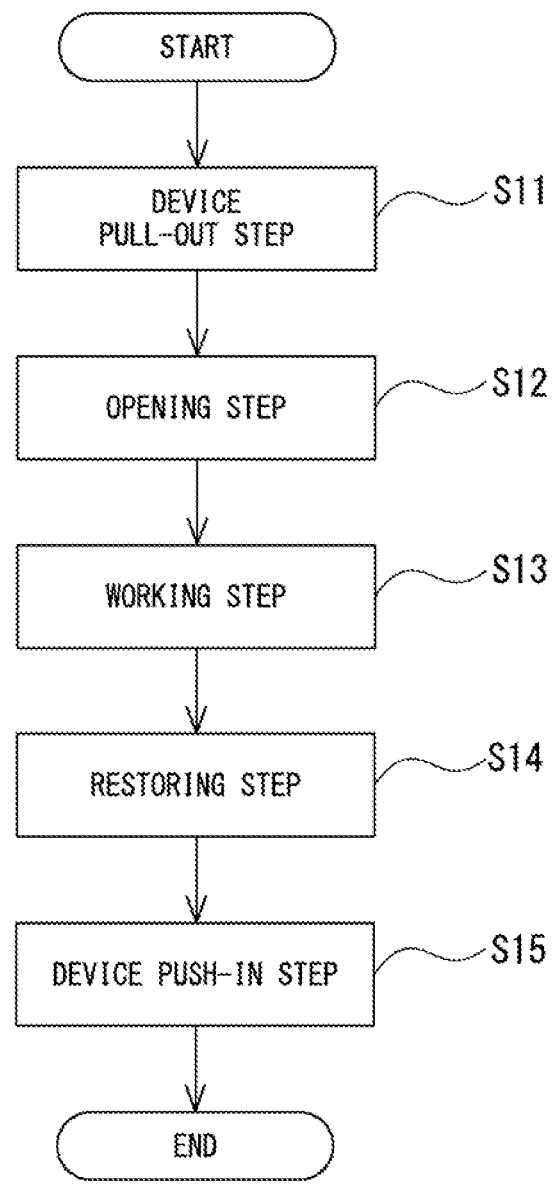
FIG. 10 is a flow chart illustrating the electronic device maintenance method according to the third embodiment.

FIG. 10 is a flow chart indicating the electronic device maintenance method according to the third embodiment.

As illustrated in FIG. 10, the maintenance method for the electronic device 30 is provided with a device pull-out step S11, an opening step S12, a working step S13, a restoring step S14, and a device push-in step S15.

In the device pull-out step S11, first, the electronic device 30 is pulled out, forward in the anterior-posterior direction Da, from a server rack. At this time, the electronic device 30 does not need to be entirely pulled out of the server rack, and just a portion at the front of the electronic device 30 in the anterior-posterior direction Da may be pulled out while still connected to a power supply.

In the opening step S12, as illustrated in FIG. 7, the cover unit 50 is slid forward by means of the guide rails 80, in the anterior-posterior direction Da, from the position P1 at which the housing 40 is covered from the front end portion 40f to the middle portion 40c thereof. At this time, the second electronic component 70 mounted on the cover unit 50 and the circuit board 60 accommodated in the housing 40 remain in a state of being connected by the connecting wire 74. The cover unit 50 is moved to a position P2 at which the area above the opening portion 46 in the housing 40 is opened. As a result thereof, the opening portion 46 is opened upwards at a portion at which the housing 40 of the electronic device 30 protrudes further forward, in the anterior-posterior direction Da, than the server rack.

In working step S13, work that must be performed on the first electronic components 61 provided in the housing 40, such as, for example, replacement work, is performed from above the opening portion 46.

In the restoring step S14, after the required work is completed, as illustrated in FIG. 6, the cover unit 50 is slid rearward in the anterior-posterior direction Da by means of the guide rails 80, and returned to the position P1 at which the housing 40 is covered from the front end portion 40f to the middle portion 40c thereof.

In the device push-in step S15, the electronic device 30 that was pulled forward, in the anterior-posterior direction Da, from the server rack is pushed rearward, in the anterior-posterior direction Da, and returned to the server rack.

As a result thereof, the maintenance on the electronic device 30 is completed. In this way, by pulling out only a portion of the electronic device 30 from the server rack, maintenance work can be performed while remaining connected to a power supply, in a so-called online state.

In the above-described device pull-out step S11, only a portion towards the front in the anterior-posterior direction Da of the electronic device 30 was pulled out from the server rack. However, depending on the specific work to be performed on the electronic device 30, the connection with the power supply may be cut off and the entire electronic device 30 may be pulled out from the server rack.

In this case also, during the above-mentioned opening step S12, the cover unit 50 is slid to open the opening portion 46 upward. As a result thereof, in the working step S13, work can easily be performed on the first electronic component 61 located under the opening portion 46.

Figure 11:
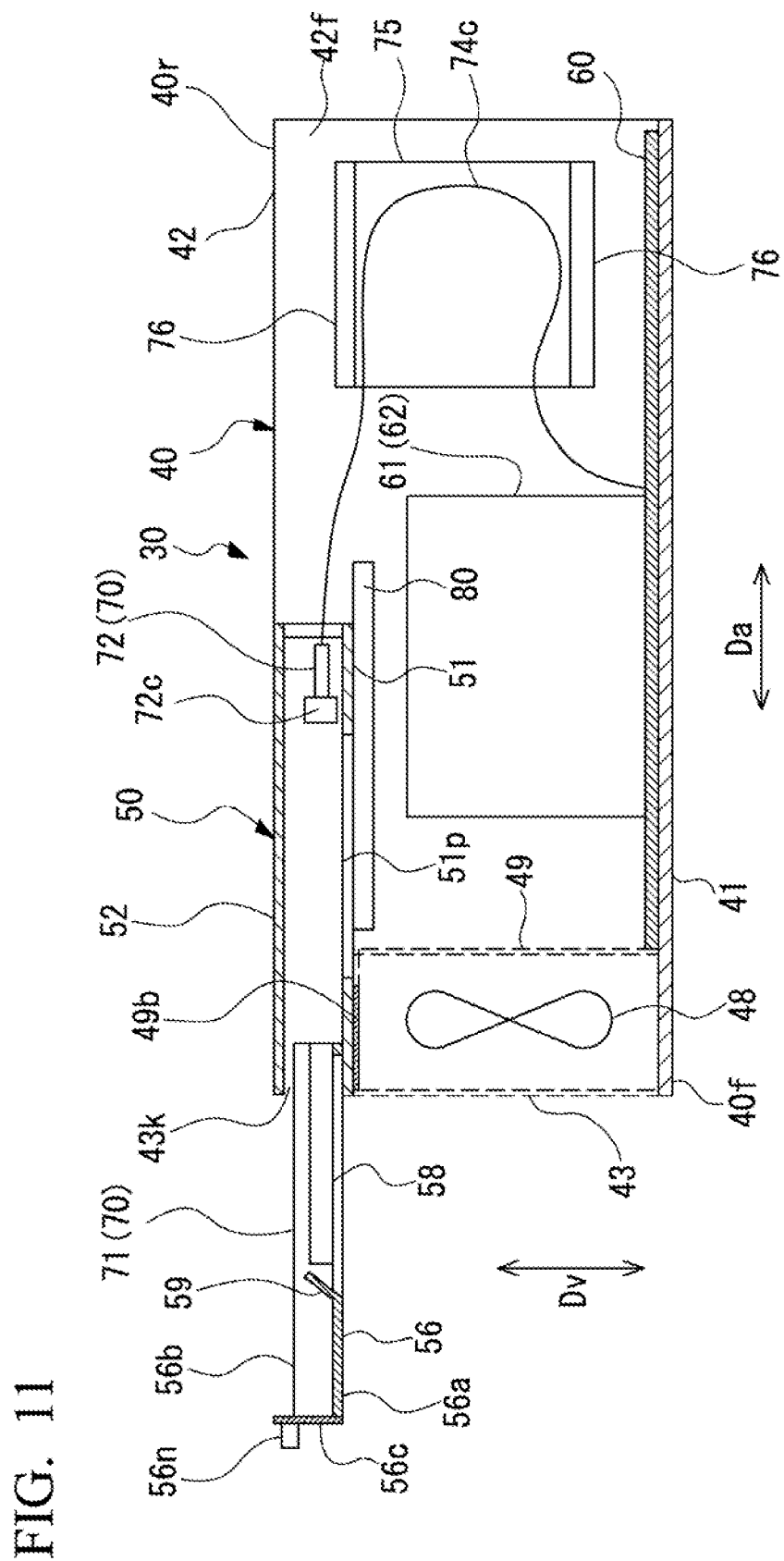
FIG. 11 is a side section view illustrating the state in which only a second electronic component and a tray have been pulled out from the cover unit of the electronic device according to the third embodiment.

FIG. 11 is a side section view illustrating the state in which only a second electronic component and a tray are pulled out from the cover unit of the electronic device according to the third embodiment.

As illustrated in FIG. 11, the storage device 71, which is at least a portion of the second electronic components 70 mounted on the cover unit 50, can be detached, together with the tray 56, through the slot opening 43k. As a result thereof, online maintenance work can be performed on the storage device 71, without pulling the electronic device 30 out from the server rack or sliding the cover unit 50.

With this electronic device 30 and the maintenance method for the electronic device 30, the area above the opening portion 46 is opened and closed by sliding the cover unit 50 by means of the guide rails 80, in a state in which the second electronic components 70 and the circuit board 60 are connected by the connecting wires 74. As a result thereof, maintenance work can be performed by replacing just the necessary components and the like through the opening portion 46, without suspending the supply of power to the entire electronic device 30. Additionally, by opening the cover unit 50, maintenance work can be easily performed on the first electronic components 8 and the circuit board 60 in the housing 2 disposed under the cover unit 50. Therefore, the work required for performing maintenance on the electronic device 30 can be suppressed.

Furthermore, the amount of components mounted on the electronic device 30 can be increased and the component mounting density in the electronic device 30 can be lowered by mounting the second electronic components 70 not only on the housing 40, but also on the cover unit 50.

The guide rails 80 support the cover unit 50 so as to be able to slide with respect to the housing 40. As a result thereof, a configuration for opening and closing the opening portion 46 by moving the cover unit 50 while the second electronic components 70 and the circuit board 60 are in a state of connection by the connecting wires 74 can be realized.

Additionally, by sliding the cover unit 50 in the anterior-posterior direction Da by means of the guard rails 80, the base plate 51 is kept in a horizontal state in a state in which the cover unit 50 is pulled out. As a result thereof, various types of work can be easily performed on the storage device 71 or the like mounted on the base plate 51.

The storage device 71 is provided so as to be detachable from the cover unit 50. As a result thereof, replacement work and the like can be performed on the storage device 71 provided on the cover unit 50 without moving the cover unit 50, as with the first electronic component 61 provided in the housing 40. As a result thereof, work can more easily be performed on the storage device 71, which is frequently replaced.

Furthermore, the storage device 71 is mounted on the tray 56, which can be pulled out of or pushed into a slot opening 43k. As a result thereof, replacement work or the like can be performed on the storage device 71 in a state in which the electronic device 30 remains mounted on the server rack. As a result thereof, work can more easily be performed on the storage device 71, which is frequently replaced.

Additionally, the connecting wire 74 has a slack portion 74c that extends along the inner surface 42f of the housing 40. As a result thereof, the connecting wire 74 can be kept from interfering with the first electronic components 61 and the like inside the housing 40 when sliding the cover unit 50.

Furthermore, the slack portion 74c is restrained from being displaced in a direction away from the inner surface 42f by means of the wire supporting portion 75 provided on the inner surface 42f of the housing 40. As a result thereof, the connecting wire 74 can be more reliably suppressed from interfering with the first electronic components 61 and the like inside the housing 40.

Additionally, the cover unit 50 extends from the front end portion 40f of the housing 40, at which the cooling fans 48 are provided, towards the rear end portion 40r. As a result thereof, a duct-shaped cooling air passage R1 that is continuous in the anterior-posterior direction is formed underneath the base plate 51. A portion W1 of the air from the cooling fans 48 passes through the cooling air passage R1, thereby efficiently cooling the first electronic components 61 disposed inside the housing 40.

Additionally, the cover unit 50 is provided with ventilation openings 58 on the downstream side in the flow direction of the air from the cooling fans 48. As a result thereof, the remaining portion W2 of the air from the cooling fans 48 can efficiently cool the second electronic components 70 mounted on the cover unit 50 by passing through the ventilation openings 58.

Furthermore, by providing air guides 59 in the ventilation openings 58, the remaining portion W2 of the air from the cooling fans 48 can be more efficiently guided to the ventilation openings 58. As a result thereof, the second electronic components 70 mounted on the cover unit 50 can be even more efficiently cooled.

The cover unit 50 was configured so as to be opened and closed in a state in which the electronic device 30 is pulled out from the server rack. However, there is no such limitation. Just the cover unit 50 may be pulled out from the electronic device 30 with the electronic device 30 remaining in a state of being accommodated in the server rack. As a result thereof, maintenance work can easily be performed with respect to the second electronic components 70 mounted on the cover unit 50.

Additionally, in the above-described third embodiment, the cover unit 50 is configured to open the opening portion 46 by sliding by means of the guide rails 80. However, there is no such limitation. The cover unit 50 may open and close the opening portion 46 by being pivotally connected to the housing 40.

Additionally, in the above-described third embodiment, the cover unit 50 was configured so as to cover the area above the opening portion 46 in the region of the housing 40 from the front end portion 40f to the middle portion 40c thereof. However, the cover unit 50 may cover the opening portion 46 over the entirety of the housing 40 from the front end portion 40f to the rear end portion 40r thereof.

Additionally, the structures of the respective portions of the electronic device 30 indicated in the above-described third embodiment are merely one example. For example, the configuration of the housing 40, the type, number and arrangement of the first electronic components 61 provided inside the housing 40, the structure of the cover unit 50, the type, number and arrangement of the second electronic components 70, and the like may be changed as appropriate. To give one example, the cover unit 50 was configured so that the second electronic components 70 and the connecting wires 74 provided on the base plate 51 were covered by the top cover 52. However, the top cover 52 may be provided thereon.

Furthermore, a plurality of electronic devices 30 as indicated in the above-described third embodiment may be accommodated in a single case and mounted on a server rack.

Additionally, the electronic device 30 is not limited to being used as a server device, and may have any other use.

Aside therefrom, features of the above-mentioned embodiments may be freely adopted or rejected, or may be changed, as appropriate, to other features, as long as they do not depart from the spirit of the present invention.

Priority is claimed on Japanese Patent Application No. 2018-211205, filed Nov. 9, 2018, the entire disclosure of which is incorporated herein by reference.

REFERENCE SIGNS LIST

1, 11, 30 Electronic device
2, 12, 40 Housing
3, 13 Cover
4, 14, 74 Connecting wire
5 Opening/closing mechanism
6, 16, 46 Opening portion
7, 17, 60 Circuit board
8, 18, 61 First electronic component
9, 19, 70 Second electronic component
43k Slot opening (slot)
48 Cooling fan
50 Cover unit (cover)
56 Tray
58 Ventilation opening
59 Air guide
60 Circuit board
61 First electronic component
70 Second electronic component
71 Storage device
72 Connection board
74c Slack portion
75 Wire supporting portion
80 Guide rail (opening/closing mechanism)
S1, S12 Opening step
S2, S13 Working step
S3, S14 Restoring step

What is claimed is:

1. An electronic device comprising:
   a housing that accommodates a circuit board and a first electronic component connected to the circuit board, and that has an opening portion that opens upward;
   a cover that is provided on an upper portion of the housing, that at least partially covers the opening portion, and that has a second electronic component mounted thereon;
   a connecting wire that connects the second electronic component to the circuit board;
   an opening/closing mechanism that can open and close the cover in a state in which the second electronic component and the circuit board are connected by the connecting wire; and
   a cooling fan provided in a first end portion, in an anterior-posterior direction, of the housing,
   wherein the cover extends from the first end portion of the housing towards a second end portion on the other side in the anterior-posterior direction, and comprises a ventilation opening that penetrates vertically therethrough on a downstream side in a flow direction of air from the cooling fan and an air guide that guides air from the cooling fan to the ventilation opening on a downstream side in a flow direction of air from the cooling fan.

2. The electronic device as claimed in claim 1, wherein the opening/closing mechanism supports the cover so as to be able to pivot or slide with respect to the housing.

3. The electronic device as claimed in claim 1, wherein the second electronic component is provided so as to be detachable from the cover.

4. The electronic device as claimed in claim 3, further comprising a tray that is provided on the cover and that can be pulled out from and pushed into a slot formed in the housing;
  wherein the second electronic component is mounted on the tray.

5. The electronic device as claimed in claim 1, wherein the connecting wire has a slack portion extending along an inner surface of the housing.

6. The electronic device as claimed in claim 5, further comprising a wire supporting portion that is provided on the inner surface of the housing and that restrains the slack portion from being displaced in a direction away from the inner surface.

7. An electronic device maintenance method comprising:
preparing, for a housing having an opening portion that opens upward and having a circuit board, a first electronic component connected to the circuit board and a cooling fan which cools the first electronic component, a cover provided at a position at least partially covering the opening portion;
moving the cover, in a state in which a second electronic component mounted on the cover is connected, by a connecting wire, to the circuit board accommodated in the housing, to a position at which an area above the opening portion is opened;
performing work on the first electronic component provided inside the housing from above the opening portion;
returning the cover to a position at least partially covering the opening portion after performing the work on the first electronic component; and
providing the cover with a ventilation opening that penetrates vertically therethrough on a downstream side in a flow direction of air from the cooling fan, and an air guide that guides air from the cooling fan to the ventilation opening on a downstream side in a flow direction of air from the cooling fan.

* * * * *